United States Patent
Thumm et al.

(10) Patent No.: US 11,821,922 B2
(45) Date of Patent: Nov. 21, 2023

(54) METHOD FOR PRODUCING A DEVICE FOR MEASURING CURRENT INTENSITIES AND DEVICE FOR MEASURING CURRENT INTENSITIES

(71) Applicant: Wieland-Werke AG, Ulm (DE)

(72) Inventors: Gerhard Thumm, Erbach (DE); Volker Voggeser, Senden (DE); Michael Wolf, Ulm (DE)

(73) Assignee: WIELAND-WERKE AG, Ulm (DE)

( * ) Notice: Subject to any disclaimer, the term of this patent is extended or adjusted under 35 U.S.C. 154(b) by 310 days.

(21) Appl. No.: 17/336,836

(22) Filed: Jun. 2, 2021

(65) Prior Publication Data
US 2021/0382092 A1 Dec. 9, 2021

(30) Foreign Application Priority Data
Jun. 9, 2020 (DE) .......................... 102020003458.6

(51) Int. Cl.
*G01R 3/00* (2006.01)
*G01R 15/14* (2006.01)
(Continued)

(52) U.S. Cl.
CPC ........... *G01R 15/146* (2013.01); *G01R 1/203* (2013.01); *G01R 3/00* (2013.01); *G01R 19/0092* (2013.01);
(Continued)

(58) Field of Classification Search
CPC .......... H05K 1/18; H05K 1/181; G01R 1/203; G01R 3/00
(Continued)

(56) References Cited

U.S. PATENT DOCUMENTS

| | | | |
|---|---|---|---|
| 8,319,499 | B2 | 11/2012 | Gronwald et al. |
| 10,163,553 | B2 | 12/2018 | Kameko et al. |
| 2012/0154104 | A1 | 6/2012 | Hetzler |

FOREIGN PATENT DOCUMENTS

| | | | |
|---|---|---|---|
| CN | 110320404 A | * 10/2019 | |
| DE | 102006019895 A1 | * 11/2007 | ......... G01R 31/3696 |

(Continued)

OTHER PUBLICATIONS

Office Action from German Patent Office issued in corresponding German Application No. 10 2020 003 458.6 dated May 6, 2021 (8 pages).

*Primary Examiner* — Livius R. Cazan
(74) *Attorney, Agent, or Firm* — FLYNN THIEL, P.C.

(57) ABSTRACT

A method for producing a device for measuring current intensities, including: providing a resistor arrangement having connection elements and a resistor element arranged therebetween in a current flow direction. The resistor element and the connection elements consist of different electrically conductive materials; forming a contact pin from the material of at least one connection element; positioning a printed circuit board with a conductor track and a passage bore on the resistor arrangement such that the contact pin projects through the passage bore and has on the side of the printed circuit board facing away from the resistor arrangement a protrusion; laterally widening the contact pin in the region of the protrusion by deforming the material such that the printed circuit board is mechanically fixed to the resistor arrangement; and producing an electrically conductive connection between the contact pin and the conductor track of the printed circuit board.

9 Claims, 5 Drawing Sheets

(51) Int. Cl.
*G01R 19/00* (2006.01)
*H01C 17/28* (2006.01)
*H01C 17/02* (2006.01)
*H05K 3/30* (2006.01)
*G01R 1/20* (2006.01)

(52) U.S. Cl.
CPC ............ *H01C 17/02* (2013.01); *H01C 17/28* (2013.01); *H05K 3/308* (2013.01)

(58) Field of Classification Search
USPC .......................................................... 29/838
See application file for complete search history.

(56) References Cited

FOREIGN PATENT DOCUMENTS

| | | | |
|---|---|---|---|
| DE | 102006019895 A1 | 11/2007 | |
| DE | 102007033182 A1 | 1/2009 | |
| DE | 102009031408 A1 | 1/2011 | |
| DE | 102011106187 A1 | 12/2011 | |
| DE | 102014207759 A1 | 1/2015 | |
| EP | 0114976 A2 * | 8/1984 | |
| EP | 0605800 A1 | 7/1994 | |
| WO | WO-2012069928 A1 * | 5/2012 | ............. H05K 3/308 |

\* cited by examiner

METHOD FOR PRODUCING A DEVICE FOR MEASURING CURRENT INTENSITIES AND DEVICE FOR MEASURING CURRENT INTENSITIES

CROSS-REFERENCE TO RELATED APPLICATION

This claims priority from German Application No. 10 2020 003 458.6, filed Jun. 9, 2020, the disclosure of which is hereby incorporated by reference in its entirety.

TECHNICAL FIELD

The invention relates to a method for producing a device for measuring current intensities and to such a device.

BACKGROUND AND SUMMARY

Measurement resistors, which are connected in series with the component to be monitored, are used for current measurement in electronic circuits. In this case, the current intensity is determined from the voltage dropped across the measurement resistor, referred to as a shunt resistor. The correct and reliable measurement of the current intensity is, for example, particularly important in a battery management system of an electric or hybrid vehicle. A resistor arrangement comprising such a low-impedance measurement resistor with approximately 10 to 50 μOhm and connection elements for connecting the resistor arrangement to the circuit can be produced from a longitudinally seam-welded composite material. This is known, for example, from document EP 0 605 800 A1. The composite material is produced from three metal ribbons by virtue of the individual metal ribbons each being connected via a longitudinal seam to one another by way of an electron beam or laser welding method.

The voltage dropped across a measurement resistor is tapped by means of contact pins or similar elements, which are arranged on both sides of the measurement resistor on the connection elements. Such contact pins can be soldered, pressed or welded to the connection elements of the resistor arrangement. The voltage is detected and processed further by a measurement and evaluation electronics system. For this purpose, electronic components that can be arranged on a printed circuit board are provided. The printed circuit board can be located in this case in direct proximity to the resistor arrangement.

DE 10 2009 031 408 A1 discloses a resistor arrangement with a low-impedance current measurement resistor. In said resistor arrangement, connection contacts, which are formed by embossing and thread forming in the plate-like parts serving to connect the resistor arrangement to the external circuit, are provided to tap the voltage. The measurement lines for voltage measurement are connected to the connection contacts by means of cable shoes and fastening screws.

Document U.S. Pat. No. 10,163,553 B2 further discloses a resistor arrangement with two plate-like elements for connecting the resistor arrangement to an external circuit and a strip-like resistor element. On both sides of the resistor element, a respective hole is present in the two connection elements, into which hole a respective contact pin is plugged. The contact pins are separate components that have to be specifically produced and added to the resistor arrangement.

In the devices known from the prior art, it is necessary to use additional components in order to tap the voltage dropped across the measurement resistor. This requires additional outlay and costs. Contact voltages that can distort the voltage signal can also arise at the contact points of the individual components.

The invention is based on the object of specifying an improved, in particular simpler and more cost-effective, method for producing a device for measuring current intensities and such a device.

The invention includes a method for producing a device for measuring current intensities by means of a resistor arrangement, wherein the method comprises the following steps:

a) providing a resistor arrangement comprising at least two connection elements and at least one resistor element arranged between the connection elements in relation to the direction of the flow of current, wherein the at least one resistor element on the one hand and the connection elements on the other hand consist of different electrically conductive materials, b) forming at least one contact pin from the material of at least one connection element, c) positioning a printed circuit board, which has at least one conductor track and at least one passage bore, on the resistor arrangement in such a way that the at least one contact pin projects through the passage bore and has on the side of the printed circuit board facing away from the resistor arrangement a protrusion extending beyond the printed circuit board, d) laterally widening the contact pin at least in the region of the protrusion thereof by deforming the material such that the printed circuit board is mechanically fixed to the resistor arrangement, e) producing an electrically conductive connection between the contact pin and at least one conductor track of the printed circuit board.

The measurement of current intensities is also understood as the measurement of the intensity of an electric current that possibly changes over time.

The resistor arrangement described above can comprise a low-impedance shunt resistor as resistor element. The connection elements of the resistor arrangement can be made of copper, a preferably low-alloyed copper alloy, of aluminum or a preferably low-alloyed aluminum alloy or comprise at least one of these materials. The resistor element can be made of a copper alloy, which is usually used as a resistor alloy. The specific electrical resistance of the resistor alloy is considerably greater than the specific electrical resistance of the material of the connection elements. The connection elements can be terminal connection elements of the resistor arrangement. However, it is also possible for at least one connection element to be arranged between two resistor elements in relation to a possible current path. The resistor arrangement can be designed in a planar arrangement. In this case, the connection elements and the at least one resistor element are formed as plate-like or strip-like elements and are arranged in a plane next to one another, preferably in a row. The thickness of the resistor element or the resistor elements can in this case be arbitrary. Usually, however, the thickness of the resistor element(s) is not greater than the thickness of the connection elements.

The printed circuit board has at least one conductor track, which is preferably arranged on the side of the printed circuit board facing away from the resistor arrangement. Electrical components that serve to measure and evaluate electrical signals can also be arranged on the printed circuit board. The term passage bore denotes a recess in the printed circuit board that extends over the entire thickness of the printed circuit board.

"Contact pin" is understood to mean a material protrusion that is raised above the otherwise non-deformed surface of a connection element. The contact pin is formed by displacing material of a connection element substantially in the direction perpendicular to the surface of the connection element. The direction in which the material is displaced defines the axis of the contact pin. The contact pin can be solid, partially hollow or hollow along the entire axis thereof. The cross-sectional shape of the contact pin can be arbitrary, preferably circular, rectangular, square or hexagonal in the case of a solid contact pin or annular in the case of a hollow contact pin. The shape and/or size of the cross section of the contact pin can be constant or change continuously or discontinuously along the extent of the contact pin. For example, a contact pin can have a slightly conical contour, that is to say a contour with boundary surfaces that are slightly inclined with respect to the surface of the connection element. The contact pin can also have a projection. A projection is understood to mean a discontinuous, that is to say sudden, change in the cross-sectional shape and/or the cross-sectional size of the contact pin. The height of the contact pin in relation to the non-deformed surface of the connection element is greater than the thickness of the printed circuit board. Consequently, the contact pin has a protrusion beyond (or projects beyond) the printed circuit board when the printed circuit board is positioned on the resistor arrangement so that the contact pin projects through the passage bore and beyond it.

The contact pin can be used, preferably together with a further contact pin, as a voltage tap for measuring the voltage dropped across at least one resistor element. As an alternative, the contact pin can also be used to ground the resistor arrangement. One or more such contact pins are preferably formed in all connection elements of the resistor arrangement. In this case, the contact pins serving for voltage measurement are positioned as closely as possible to the resistor element at which the voltage drop is intended to be determined.

The lateral widening of the contact pin in method step d) denotes a deformation of the contact pin by displacing the material perpendicularly to the axis of the contact pin, that is to say a radial displacement—in relation to the axis. Said deformation takes place to a greater extent in the region of the contact pin that projects beyond the printed circuit board. In said region, the lateral extent of the displaced material after method step d) is, at least locally, greater than the width of the passage bore. Said deformation of the contact pin fixes the printed circuit board to the resistor arrangement. In particular, the contact pin can obtain a shape similar to that of a mushroom or a nail in the region of the nail head due to the lateral widening of the section thereof that protrudes beyond the printed circuit board. The cross-section of the contact pin in the axial direction can be, in particular, T-shaped.

The lateral widening of the contact pin also takes place to a lesser extent in the region located within the passage bore of the printed circuit board. In said region, the lateral widening is limited by the inner wall of the passage bore.

The particular advantage of the described method is that no additional components and/or materials are required to produce the connection between the resistor arrangement and the printed circuit board. Because the contact pin is formed directly from the material of a connection element, it is not necessary to mount it separately on the resistor arrangement or on the printed circuit board. The working steps necessary for this and the required materials, such as solder, for example, are dispensed with. Several contact pins can be formed at the same time. The monolithic connection between the connection element and contact pin prevents undesired contact voltages that may distort a measurement.

If the resistor arrangement is produced by virtue of it being cut to length from a longitudinally seam-welded, ribbon-like composite material, then the contact pins can be formed at the same time as the composite material is cut to length. Steps a) and b) of the method thus take place at the same time in this case. A separate additional working step for forming the contact pins is therefore not necessary. The method is therefore more rapid and more cost-effective than if the contact pins are formed only after the composite material is cut to length. In this way, a high positional accuracy of the contact pins is also achieved.

Within the context of a preferred embodiment of the invention, the contact pin can be formed in method step b) by an embossing step or by extrusion. Embossing and extrusion are suitable particularly for forming contact pins that are monolithically connected to the material of the connector elements and that extend substantially perpendicularly to the surface of the connection elements. The material is formed here by means of a stamp.

Within the context of a specific configuration of this embodiment of the invention, a negative form with at least one recess corresponding to the contour of the contact pin can be used to shape the contact pin. The outer contour of the contact pin can be determined by such a negative form.

Within the context of a further preferred embodiment of the invention, the contact pin can be widened laterally in method step d) by an upsetting process, by embossing, by caulking or by flanging. Flanging is preferably applied here in the case of a contact pin that is hollow along the entire axis thereof, whereas the other methods are preferably used in the case of a solid or only partially hollow contact pin. With said method, the power necessary for the lateral deformation is introduced in the direction of the axis of the contact pin. The material of the contact pin is therefore not only laterally widened but also pressed in the direction of the axis thereof onto the printed circuit board. The mentioned methods are therefore particularly well suited to widening the part of the contact pin that projects beyond the printed circuit board in all or only in certain directions perpendicular to the axis of the contact pin and at the same time to achieving good mechanical fixing of the printed circuit board to the resistor arrangement.

Within the context of a specific configuration of the invention, the lateral widening of the contact pin in method step d) is supported by heating the material by means of ultrasound or by means of a laser. The material of the contact pin is very solidified and hard on account of the deformation in method step b). This is a hindrance to the subsequent deformation in step d). Through the introduction of heat by means of a laser or by means of ultrasound, the material of the contact pin can be heated to the extent that it at least partly softens, that is to say becomes softer. The deformation in step d) is then more easily possible.

The electrically conductive connection can advantageously be produced in method step e) by laterally widening the contact pin in the region of the protrusion thereof in method step d). By deforming the contact pin in step d), a force-fitting connection is produced between the printed circuit board and the contact pin. In this case, it is also advantageously provided that the widened region of the contact pin comes into contact with at least one conductor track located on the surface of the printed circuit board facing away from the resistor arrangement. The force-fitting connection between the printed circuit board and the contact pin then also leads to an electrical connection between the contact pin and the conductor track.

Within the context of an additional embodiment of the invention, the electrically conductive connection can be produced in method step e) by the contact pin being deformed in such a way that it makes contact with the inner surface of the passage bore of the printed circuit board. In this case, the inner surface of the passage bore has an electrically conductive material that is connected to at least one conductor track of the printed circuit board. Laterally widening the contact pin in step d) results in a force-fitting connection between the contact pin and the inner side of the passage bore, for example in the manner of a press fit. In this way, a particularly good electrical contact can be produced between the contact pin and the printed circuit board.

With respect to further technical features and advantages of the method according to the invention, reference is made here explicitly to the explanations below in connection with the device according to the invention and to the figures and the description of the figures.

A further aspect of the invention includes a device for measuring current intensities. This is also understood as the measurement of the intensity of an electric current that possibly changes over time. The device comprises a resistor arrangement and a printed circuit board mechanically and electrically connected to the resistor arrangement. The resistor arrangement comprises at least two connection elements and at least one resistor element arranged between the connection elements in relation to the direction of the flow of current, wherein the at least one resistor element on the one hand and the connection elements on the other hand consist of different electrically conductive materials. The printed circuit board has at least one passage bore. The printed circuit board also has at least one conductor track, which is preferably arranged on the side of the printed circuit board facing away from the resistor arrangement. According to the invention, the resistor arrangement has at least one contact pin monolithically connected to one of the connection elements and formed out of the material of the connection element, by way of which contact pin the resistor arrangement is connected to the printed circuit board by virtue of the contact pin extending through the passage bore of the printed circuit board, projecting beyond it and having a lateral widening on the side of the printed circuit board facing away from the resistor arrangement and by way of which the printed circuit board is mechanically fixed to the resistor arrangement.

In respect of the terms used to describe the device, reference is made here explicitly to the above explanations of the terms in connection with the description of the method for producing such a device.

The particular advantage of the described device consists in that the monolithic connection between connection element and contact pin prevents undesired contact voltages that can distort a measurement. The device can also be produced cost-effectively and with a high degree of precision since the contact pin is directly formed out of the material of the connection element.

Within the context of one embodiment of the device, the at least one contact pin can be in electrical contact with at least one conductor track of the printed circuit board by means of the lateral widening of said contact pin. The printed circuit board is then mechanically fixed to the resistor arrangement and said components are then electrically contact-connected by way of the contact pin.

Within the context of a further embodiment of the device, the at least one contact pin can be in electrical contact with the inner surface of the passage bore of the printed circuit board.

Within the context of a further advantageous embodiment of the device, the at least one contact pin can have a projection, on which the printed circuit board rests in such a way that the printed circuit board is spaced apart from the connection element and therefore from the resistor arrangement. The spacing between the printed circuit board and the resistor arrangement brings about better thermal decoupling of the printed circuit board from the resistor arrangement. The heat that arises when current flows through the resistor element in this case cannot be transmitted directly from the resistor element or from a connection element to the printed circuit board but instead the heat must flow through the contact pin. The contact pin constitutes a large heat resistance because of the relatively small cross section thereof. The flow of heat from the resistor arrangement to the printed circuit board is therefore reduced and the printed circuit board remains at a lower temperature level than if the printed circuit board were to rest directly on a connection element. This embodiment is particularly advantageous when the thickness of the resistor element is not smaller than the thickness of the connection elements.

In an advantageous configuration of the invention, the surface of the at least one contact pin can have a metallic coating, in particular a coating containing tin, silver or nickel. Such a coating prevents corrosion and can therefore ensure that the electrical contact between the contact pin and the conductor track is of a high quality over the entire service life of the device. In this case, the coating may have been applied before the forming of the contact pin in step b) or the contact pin may have been coated in a separate step between method steps b) and c).

With respect to further technical features and advantages of the device according to the invention, reference is made here explicitly to the explanations in connection with the method according to the invention described above and to the figures and the description of the figures.

BRIEF DESCRIPTION OF THE DRAWINGS

Parts corresponding to one another are provided with the same reference symbols throughout the figures.

DETAILED DESCRIPTION

Figure 1:
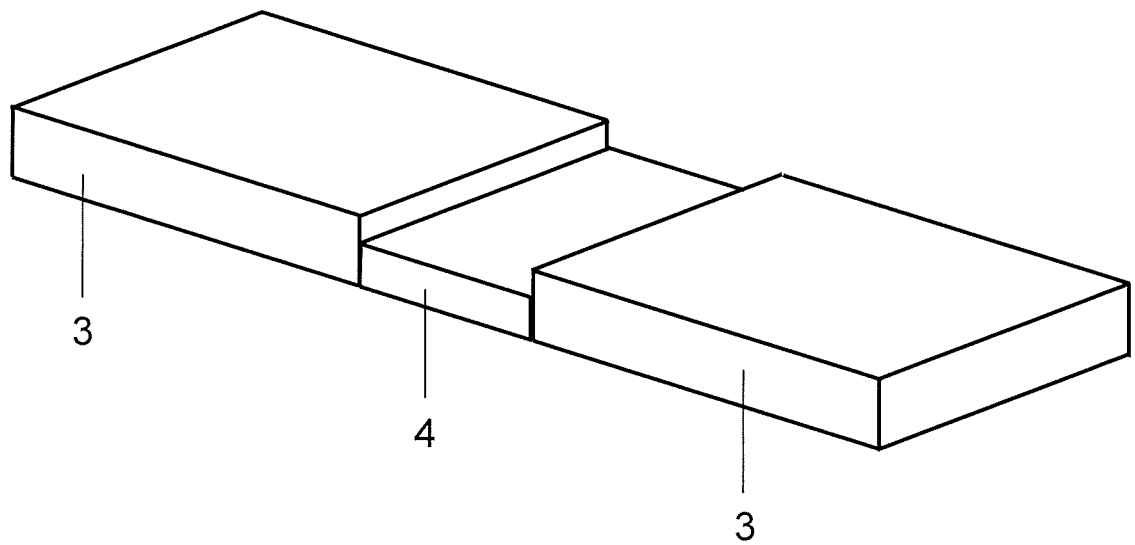
FIG. 1 shows an oblique view of a resistor arrangement.

FIG. 1 shows an oblique view of a resistor arrangement 2 without a contact pin. The resistor arrangement 2 has two terminal connection elements 3 and a resistor element 4, which is positioned between the two connection elements 3.

The connection elements 3 and the resistor element 4 each have a plate-like shape. The thickness of the resistor element 4 is somewhat less than the thickness of the two connection elements 3. The resistor arrangement 2 can be connected to a circuit at the two connection elements 3. For this purpose, the two connection elements 3 can have connecting devices (not illustrated), for example bores. Said connecting devices are each mounted in the region of the connection elements 3 that is remote from the resistor element 4. The resistor element 4 is located between the connection elements 3 in relation to the direction of current flow. When current flows, a voltage drops across the resistor element 4, based on which the intensity of the current flowing through the resistor arrangement 2 can be determined.

Figure 2:
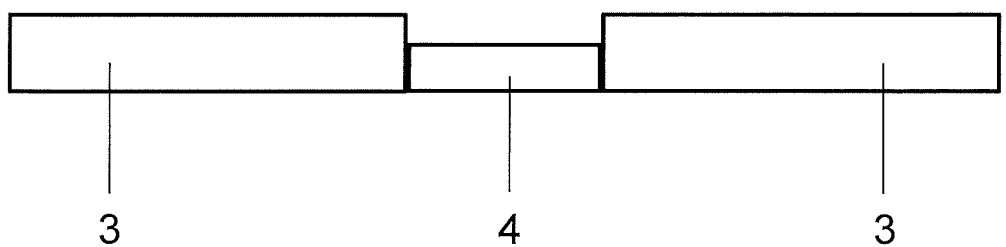
FIG. 2 shows a side view of a resistor arrangement.

FIG. 2 shows a side view of a resistor arrangement 2 according to FIG. 1. A resistor arrangement 2 as illustrated in FIGS. 1 and 2 can be produced in a known way by longitudinal seam-welding three ribbons to form a composite material and subsequently cutting the welded composite material to length.

Figure 3:
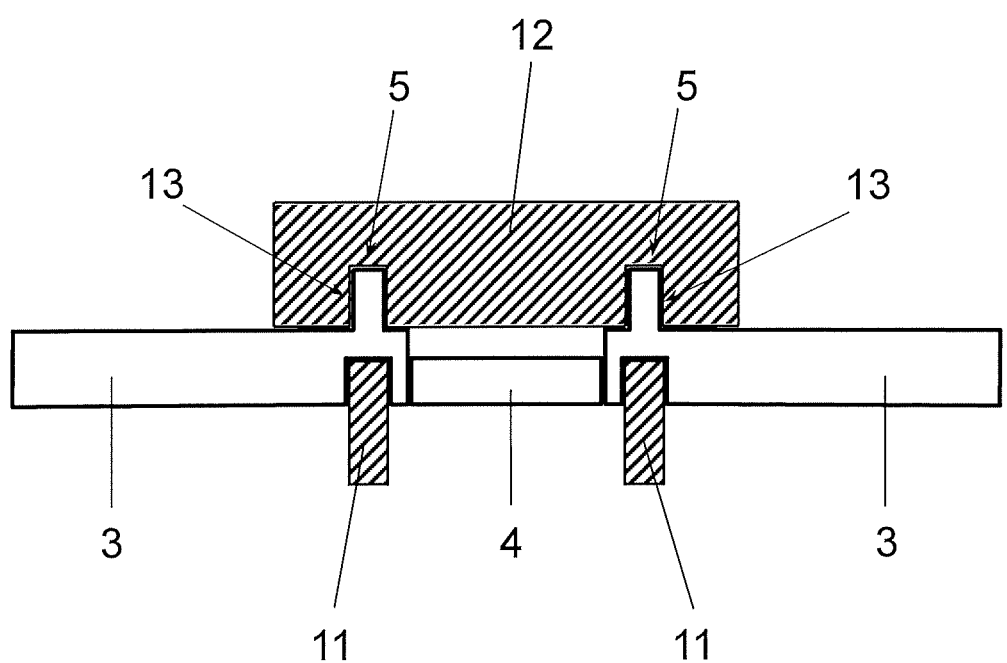
FIG. 3 shows a resistor arrangement upon conclusion of method step b)

FIG. 3 shows the resistor arrangement 2 according to FIGS. 1 and 2 upon completion of method step b). A negative form 12 with two recesses 13 has been positioned on the top side of the resistor arrangement 2. Two stamps 11 have been pressed into the material of the two connection elements 3 on the underside of the resistor arrangement 2. The stamps 11 are positioned so that they lie opposite the recesses 13 of the negative shape 12. By pressing in the stamps 11, material of the connection elements 3 has been dislodged perpendicularly to the surface of the connection elements 3 and displaced into the recesses 13 of the negative form 12. In this way, two material projections have been formed, which form contact pins 5. The contact pins 5 are embodied as solid in the case illustrated.

Figure 4:
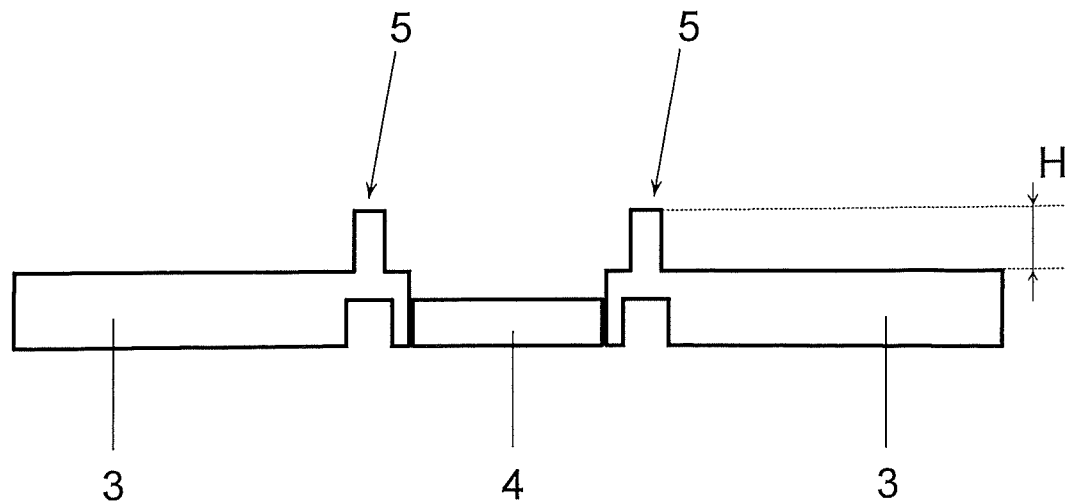
FIG. 4 shows a resistor arrangement with formed contact pins.

FIG. 4 shows the resistor arrangement 2 with two formed contact pins 5 according to method step b). The stamps 11 and the negative form 12 have been removed. To facilitate the removal of the stamps 11 and the negative form 12, the stamps 11 and the recesses 13 in the negative form 12 can each have a contour with bevels for demolding. Accordingly, the formed contact pins 5 can likewise have a contour with bevels. The angle that the bevels for demolding enclose with the normals on the surface of the connection elements 3 is typically approximately 2°. On account of said low deviation from the normals, the bevels are not explicitly illustrated in the figures. The height of the contact pins 5 is denoted by the symbol H. The contact pins 5 are provided to tap the voltage dropped across the resistor element 4. To minimize distortions in the measured value, the contact pins 5 have been formed from the connection elements 3 in such a way that they are positioned close to the connecting point between the respective connection element 3 and the resistor element 4.

Figure 5:
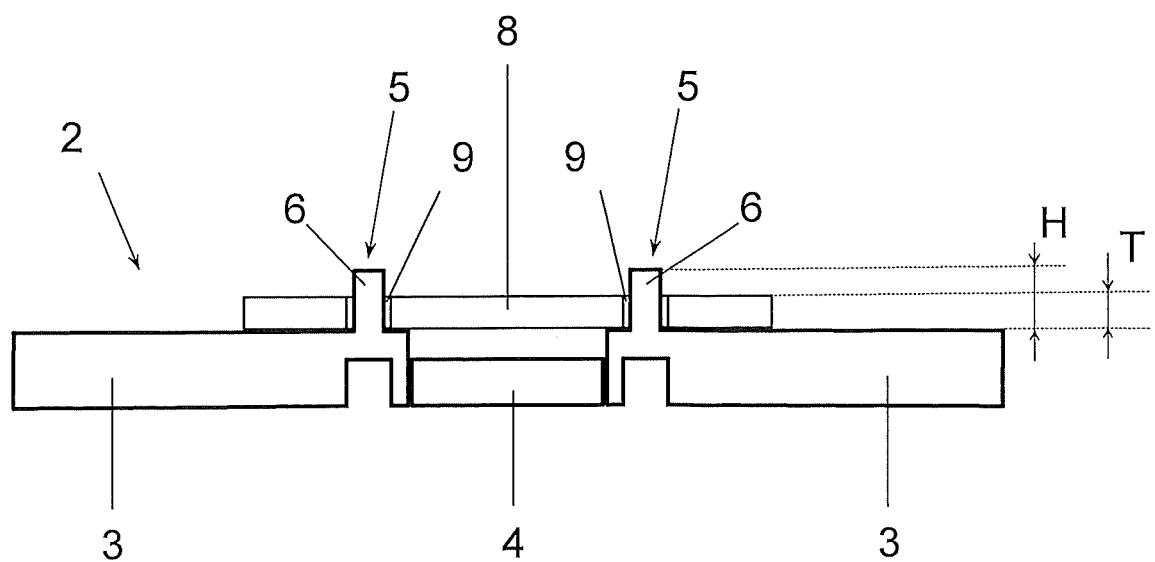
FIG. 5 shows a resistor arrangement with a printed circuit board positioned thereon.

FIG. 5 shows the resistor arrangement 2 with two formed contact pins 5 and a printed circuit board 8 positioned on the resistor arrangement 2. FIG. 5 therefore illustrates the resistor arrangement 2 and the printed circuit board 8 after method step c). The printed circuit board 8 has two passage bores 9. The printed circuit board 8 has been positioned so that the contact pins 5 project through the passage bores 9. The height H of the contact pins 5 is greater than the thickness T of the printed circuit board 8 such that the contact pins 5 each have on the side of the printed circuit board 8 facing away from the resistor arrangement 2 a protrusion 6 which extends beyond the printed circuit board 8. The clear width or size of the passage bores 9 is slightly larger than the external dimension of the contact pins 5.

Figure 6:
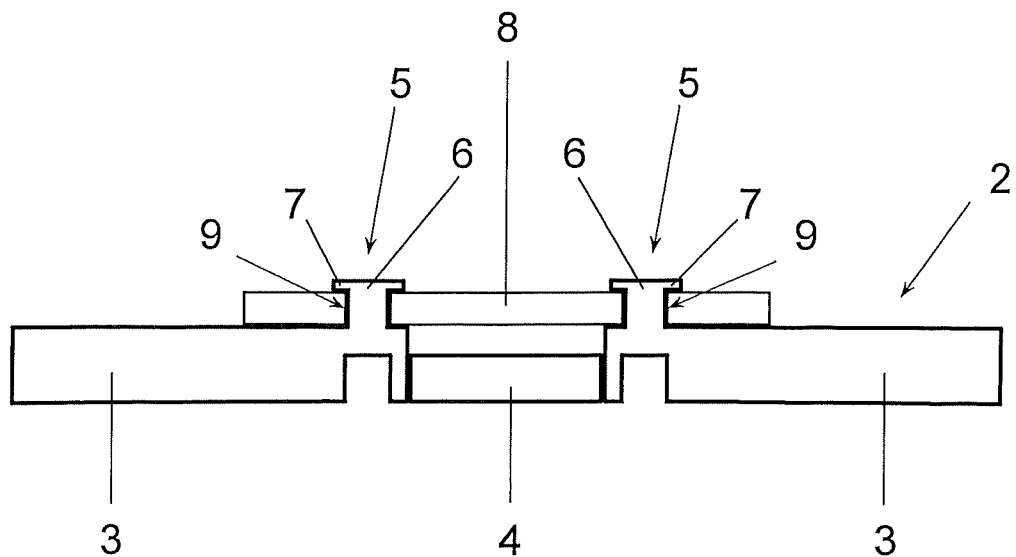
FIG. 6 shows a resistor arrangement with a printed circuit board fixed thereto.

FIG. 6 shows a device 1 for measuring current intensities with a resistor arrangement 2 and a printed circuit board 8 fixed to the resistor arrangement 2. FIG. 6 shows the device 1 after method step e). The two contact pins 5 of the resistor arrangement 2 have been deformed so that they mechanically fix the printed circuit board 8 to the resistor arrangement 2 and at the same time each establish an electrical contact with each conductor track of the printed circuit board 8. To this end, the contact pins 5 have been laterally widened both in the region of the protrusion 6 thereof beyond the printed circuit board 8 and in the region located within the passage bore 9 of the printed circuit board 8. In the region of the passage bore 9, the lateral widening is limited by the inner wall of the passage bore 9. The contact pins 5 fill the respective passage bore 9 in a form-fitting manner. In the region of the protrusion 6, the deformation is effected to the extent that a respective lateral widening 7 is produced, which extends further than the width of the respective passage bore 9. The contact pins 5 therefore obtain a shape with a T-shaped cross section in the axial direction. As a result, the printed circuit board 8 is fixed in a force-fitting manner to the resistor arrangement 2. At the same time, the lateral widening 7 of each contact pin 5 makes contact with in each case at least one conductor track on the side of the printed circuit board 8 facing away from the resistor arrangement 2. Electrical connections are therefore established between the resistor arrangement 2 and the printed circuit board 8. The conductor tracks are connected to electronic components (not illustrated), by means of which the voltage dropped across the resistor element 4 can be determined.

Figure 7:
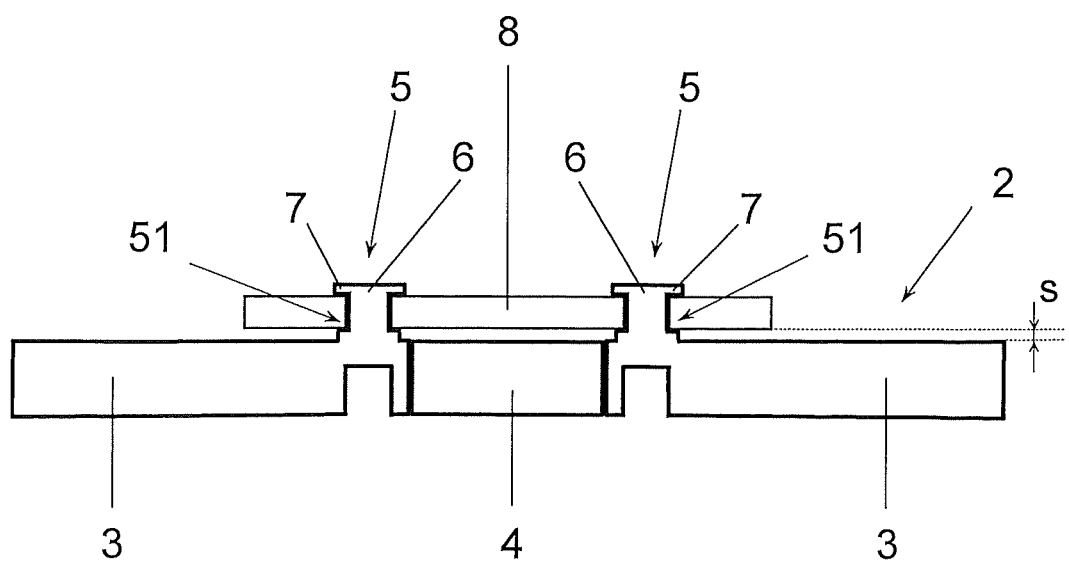
FIG. 7 shows a device with contact pins with projections.

FIG. 7 shows a further exemplary embodiment of a device 1 for measuring current intensities with a resistor arrangement 2 and a printed circuit board 8 fixed to the resistor arrangement 2. In the exemplary embodiment illustrated in FIG. 7, the thickness of the resistor element 4 is approximately equal to the thickness of the connection elements 3. The contact pins 5 each have a projection 51, which surrounds the contact pin 5 and on which the printed circuit board 8 rests. For this purpose, the contact pins 5 are designed so that the external dimensions of the contact pins 5 in the subregion of the respective contact pin 5 directly adjoining a connection element 3 is in each case greater than the clear width of the respective passage bore 9 of the printed circuit board 8. The printed circuit board 8 therefore does not rest either directly on the connection elements 3 or on the resistor element 4 but instead has a spacing s from the connection elements 3, from the resistor element 4 and therefore from the entire resistor arrangement 2. The printed circuit board is thus better thermally decoupled from the resistor arrangement. When the contact pins 5 are formed from the material of the respective connection element 3, the height of the respective projection 51 has already been taken into account. The fixing and contact-connection of the printed circuit board 8 by way of the contact pins 5 is effected in a manner analogous to the exemplary embodiment illustrated in FIG. 6 and explained in connection with FIG. 6.

FIG. 7 shows a further exemplary embodiment of a device 1 for measuring current intensities with a resistor arrangement 2 and a printed circuit board 8 fixed to the resistor arrangement 2. In the exemplary embodiment illustrated in FIG. 7, the thickness of the resistor element 4 is approximately equal to the thickness of the connection elements 3. The contact pins 5 each have a projection 51, which surrounds the contact pin 5 and on which the printed circuit board 8 rests. For this purpose, the contact pins 5 are designed so that the external dimensions of the contact pins 5 in the subregion of the respective contact pin 5 directly adjoining a connection element 3 is in each case greater than the clear width of the respective passage bore 9 of the printed circuit board 8. The printed circuit board 8 therefore does not rest either directly on the connection elements 3 or on the resistor element 4 but instead has a spacing s from the connection elements 3, from the resistor element 4 and therefore from the entire resistor arrangement 2. The printed circuit board is thus better thermally decoupled from the resistor arrangement. When the contact pins 5 are formed from the material of the respective connection element 3, the height of the respective projection 51 has already been taken into account. The fixing and contact-connection of the printed circuit board 8 by way of the contact pins 5 is effected in a manner analogous to the exemplary embodiment illustrated in FIG. 6 and explained in connection with FIG. 6.

Figure 8:
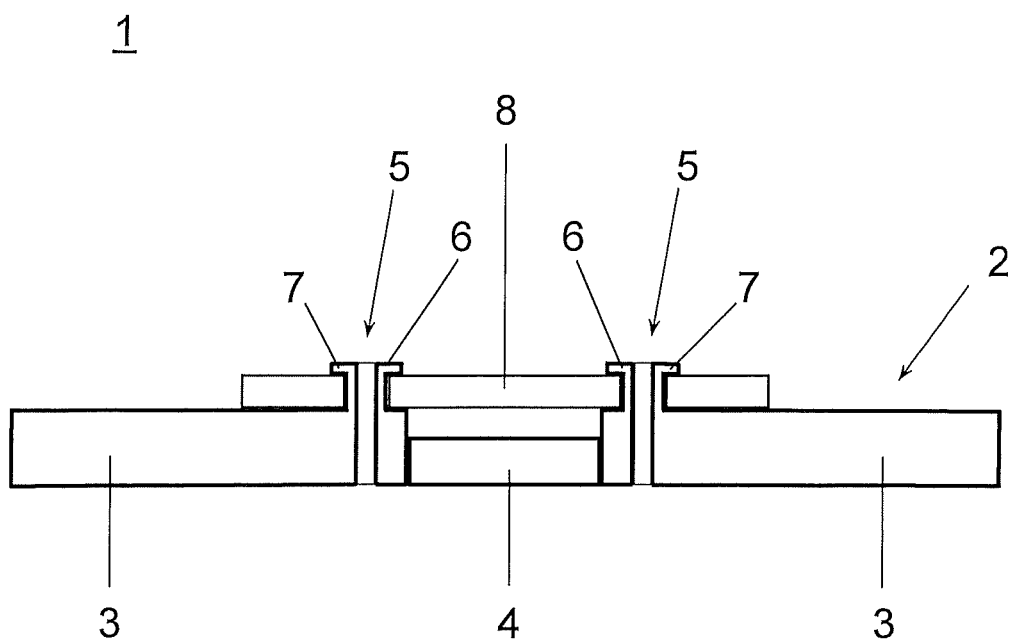
FIG. 8 shows a device with hollow contact pins.

FIG. 8 shows as a further exemplary embodiment a device 1 for measuring current intensities with a resistor arrangement 2 and a printed circuit board 8 fixed to the resistor arrangement 2, wherein the contact pins 5 are each embodied to be hollow over their entire extent. In order to produce a respective lateral widening 7 to fix the printed circuit board 8, the contact pins 5 have been flanged in the region of the protrusion 6 thereof. The contact pins 5 have a shape similar to that of a hollow rivet. In the exemplary embodiment of the device 1 illustrated in FIG. 8, the printed circuit board 8 rests on the two connection elements 3. As an alternative, it would also be possible to embody the hollow contact pins 5 with a projection 51, similar to the contact pins 5 illustrated in FIG. 7, such that the printed circuit board 8 is spaced apart from the connection elements 3.

For reasons of better illustrability, the invention has been explained in FIGS. 1 to 8 in an exemplary manner on the basis of resistor arrangements 2 that each comprise only one resistor element 4 and two terminal connection elements 3. It is also possible to apply the method described above to resistor arrangements that have two or more resistor elements 4 and at least one further connection element 3 arranged between two resistor elements 4 in relation to a possible current path. The resistor arrangement can in this case be configured so that the same current flows through at least two resistor elements 4, which makes a redundant current measurement possible, or that different currents flow through at least two resistor elements 4, which makes the measurement of partial currents possible. The method for forming contact pins 5 and for producing a mechanical and electrical connection to a printed circuit board 8 explained based on the above description, based on 1 to 8 and based on the exemplary embodiments can in these cases also be used to form one or more contact pins 5 from the material of a connection element 3 arranged between two resistor elements 4.

The invention claimed is:

1. A method for producing a device for measuring current intensities with a resistor arrangement, wherein the method comprises the following steps:
    providing a resistor arrangement comprising at least two connection elements and at least one resistor element arranged between the connection elements in relation to the direction of the flow of current, the at least one resistor element and the connection elements comprising different electrically conductive materials;
    forming at least one contact pin by displacing the material of at least one of the connection elements so that the at least one contact pin is monolithically connected to the at least one connection element;
    positioning a printed circuit board, which printed circuit board has at least one conductor track and at least one passage bore, on the resistor arrangement such that the at least one contact pin projects through the passage bore and has, on a side of the printed circuit board facing away from the resistor arrangement, a protrusion extending beyond the printed circuit board;
    laterally widening the at least one contact pin at least in a region of the protrusion by deforming the material of the at least one contact pin to mechanically fix the printed circuit board to the resistor arrangement; and
    producing an electrically conductive connection between the at least one contact pin and the at least one conductor track of the printed circuit board.

2. The method according to claim 1, wherein the step of forming the at least one contact pin comprises embossing or extrusion.

3. The method according to claim 2, wherein the step forming the at least one contact pin comprises using a negative form to shape the at least one contact pin, the negative form having at least one recess corresponding to a desired contour of the at least one contact pin.

4. The method according to claim 1, wherein the step of laterally widening comprises laterally widening the at least one contact pin by an upsetting process; by embossing; by caulking; or by flanging.

5. The method according to claim 1, wherein the step of laterally widening comprises heating the material of the at least one contact pin by ultrasound or by a laser.

6. The method according to claim 1, wherein the step of laterally widening the at least one contact pin in the region of the protrusion produces the electrically conductive connection between the at least one contact pin and at least one conductor track of the printed circuit board.

7. The method according to claim 1, wherein the step of producing the electrically conductive connection comprises deforming the at least one contact pin such that the at least one contact pin makes contact with an inner surface of the passage bore of the printed circuit board.

8. The method according to claim 1, wherein the deforming of the step of laterally widening the at least one contact pin in the region of the protrusion comprises displacing the material of the at least one contact pin perpendicular to an axis of the at least one contact pin such that a lateral extent of the displaced material is greater than a width of the passage bore of the printed circuit board.

9. The method according to claim 6, wherein the step of laterally widening the at least one contact pin in the region of the protrusion forms a widened region of the at least one contact pin which contacts the at least one conductor track, the at least one conductor track being located on a surface of the side of the printed circuit board facing away from the resistor arrangement, to produce the electrically conductive connection.

* * * * *

UNITED STATES PATENT AND TRADEMARK OFFICE
CERTIFICATE OF CORRECTION

| | |
|---|---|
| PATENT NO. | : 11,821,922 B2 |
| APPLICATION NO. | : 17/336836 |
| DATED | : November 21, 2023 |
| INVENTOR(S) | : Gerhard Thumm et al. |

It is certified that error appears in the above-identified patent and that said Letters Patent is hereby corrected as shown below:

In the Claims

Claim 3, Column 10, Lines 25-26; change "wherein the step forming the" to ---wherein the step of forming the---

Signed and Sealed this
Second Day of January, 2024

Katherine Kelly Vidal
Director of the United States Patent and Trademark Office